(12) United States Patent
Yun et al.

(10) Patent No.: US 10,698,141 B2
(45) Date of Patent: Jun. 30, 2020

(54) IMAGE SENSOR INCLUDING BROAD BAND COLOR FILTER

(71) Applicant: SAMSUNG ELECTRONICS CO., LTD., Suwon-si (KR)

(72) Inventors: Seokho Yun, Hwaseong-si (KR); Sookyoung Roh, Hwaseong-si (KR); Ilhwan Kim, Yongin-si (KR); Hongkyu Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 219 days.

(21) Appl. No.: 15/870,064

(22) Filed: Jan. 12, 2018

(65) Prior Publication Data

US 2018/0292585 A1    Oct. 11, 2018

(30) Foreign Application Priority Data

Apr. 7, 2017    (KR) .................. 10-2017-0045307

(51) Int. Cl.
   *G02B 5/20*    (2006.01)
   *H01L 27/146*    (2006.01)
   *G01J 1/04*    (2006.01)

(52) U.S. Cl.
   CPC ............ *G02B 5/201* (2013.01); *G01J 1/0492* (2013.01); *H01L 27/14621* (2013.01); *H01L 27/14645* (2013.01)

(58) Field of Classification Search
   CPC ......... H01L 27/14621; H01L 27/14625; H01L 27/14645
   USPC .............................................. 250/208.1, 226
   See application file for complete search history.

(56) References Cited

U.S. PATENT DOCUMENTS

| | | | |
|---|---|---|---|
| 9,356,065 | B2 | 5/2016 | Nam et al. |
| 2007/0076105 | A1 | 4/2007 | Inokuma |
| 2016/0006995 | A1 | 1/2016 | Yun et al. |
| 2016/0054173 | A1 | 2/2016 | Kim et al. |
| 2016/0065914 | A1 | 3/2016 | Choi et al. |
| 2016/0118430 | A1 | 4/2016 | Nam et al. |
| 2016/0254303 | A1 | 9/2016 | Takimoto et al. |
| 2017/0098672 | A1 | 4/2017 | Yun et al. |

(Continued)

FOREIGN PATENT DOCUMENTS

| | | |
|---|---|---|
| EP | 1855320 A1 | 11/2007 |
| KR | 10-2017-0041089 A | 4/2017 |

OTHER PUBLICATIONS

Communication dated Jul. 26, 2018, issued by the European Patent Office in counterpart European Patent Application No. 18159301.3.

*Primary Examiner* — Kevin K Pyo
(74) *Attorney, Agent, or Firm* — Sughrue Mion, PLLC

(57) ABSTRACT

Provided is an image sensor comprising a color separation element. The image sensor includes a pixel array including a plurality of a first pixels, a plurality of second pixels, and a plurality of third pixels; color separation elements configured to direct light in a second wavelength band travel toward the second pixels and direct a mixture light in a first wavelength band and light in a third wavelength band travel toward the first pixels or the third pixels; and a color filter layer including a first color filter, a second color filter, and a third color filter, wherein the pass bandwidth of the second color filter is greater than the pass bandwidth of each of the first and third color filters.

23 Claims, 10 Drawing Sheets

(56) References Cited

U.S. PATENT DOCUMENTS

2017/0170220 A1\* 6/2017 Nam ................ H01L 27/14605
2017/0179178 A1\* 6/2017 Park ................ H01L 31/02165

\* cited by examiner

IMAGE SENSOR INCLUDING BROAD BAND COLOR FILTER

CROSS-REFERENCE TO RELATED APPLICATION

This application claims priority to Korean Patent Application No. 10-2017-0045307, filed on Apr. 7, 2017, in the Korean Intellectual Property Office, the disclosure of which is incorporated herein in its entirety by reference.

BACKGROUND

1. Field

Apparatuses consistent with exemplary embodiments relate to an image sensor including a broadband color filter, and more particularly, to an image sensor comprising a color separation element and a broadband color filter.

2. Description of the Related Art

Color display devices or color image sensors usually display an image of various colors or detect colors of incident light by using a color filter. A red, green, and blue (RGB) color filter method, in which, for example, a green filter is arranged at two of four pixels, a blue filter is arranged at one pixel, and a red filter is arranged at one pixel, is most widely used in current color display device and color image sensors. In addition to the RGB color filter method, a cyan, yellow, green, magenta (CYGM) color filter method may be employed in which color filters of cyan, yellow, green, and magenta, which are complementary colors, are respectively arranged at four pixels.

However, a color filter may have low light use efficiency because the color filter absorbs light of colors other than the color corresponding to the color filter. For example, when an RGB color filter is in use, only ⅓ of the incident light is transmitted and the other light, that is ⅔ of the incident light, is absorbed by the filters. Accordingly, the light use efficiency may be only about 33%. Accordingly, in a color display device or a color image sensor, most of the light loss occurs in the color filter.

Recently, to improve the light use efficiency of color display devices and or color image sensors, a color separation element has been used in place of a color filter. A color separation element may separate incident light into different colors using the diffraction or refraction characteristics of light that vary according to wavelength. The light separated into different colors by the color separation element may be made incident on pixels corresponding to the colors, respectively.

SUMMARY

Exemplary aspects will be set forth in part in the description which follows and, in part, will be apparent from the description, or may be learned by practice of the presented exemplary embodiments.

According to an aspect of an exemplary embodiment, an image sensor includes a pixel array including a first pixel row in which a plurality of first pixels and a plurality of second pixels are alternately arranged and a second pixel row in which a plurality of second pixels and a plurality of third pixels are alternately arranged; a color separation element that is arranged facing each of the second pixels and is configured to direct light in a make wavelength band light toward the second pixels and direct a mixture of light in a first wavelength band and light in a third wavelength band toward the first pixels or the third pixels; and a color filter layer including a first color filter corresponding to each of the first pixels, a second color filter corresponding to each of the second pixels, and a third color filter corresponding to each of the third pixels, wherein, the pass band of the second color filter is selected, such that an average crosstalk among a first channel corresponding to the first wavelength band, a second channel corresponding to the second wavelength band, and a third channel corresponding to the third wavelength band is from about 17% to about 25%.

For example, the first wavelength band may be 630 nm±10 nm, the second wavelength band may be 540 nm±10 nm, and the third wavelength band may be 450 nm±10 nm.

The second color filter may include an organic dye or an organic pigment.

The thickness of the second color filter may be smaller than the thickness of either of the first color filter and the third color filter.

The concentration of an organic dye or an organic pigment in the second color filter may be lower than the concentration of an organic dye or an organic pigment in the first color filter and the third color filter.

Furthermore, the second color filter may include an inorganic material.

The second color filter may include a first dielectric layer having a first refractive index and a second dielectric layer having a second refractive index different from the first refractive index, and the first dielectric layer and the second dielectric layer may be alternately stacked at least once.

The second color filter may have a fine pattern structure patterned to transmit light in an entirety of the second wavelength band, light in a part of the first wavelength band, less than the entirety of the first wavelength band, and light in a part of the third wavelength band, less than an entirety of the third wavelength band.

The first color filter may be configured to transmit light in the first wavelength band, the second color filter may be configured to transmit light in the entirety of the second wavelength band, light in a part of the first wavelength band, less than an entirety of the first wavelength band, and light in a part of the third wavelength band, less than an entirety of the third wavelength band, and the third color filter may be configured to transmit light in the third wavelength band.

The first color filter may be configured to transmit light in the first wavelength band, the second color filter may be configured to transmit light in an entirety of the second wavelength band, light in a part of the first wavelength band, less than an entirety of the first wavelength band, and light in a part of the third wavelength band, less than an entirety of the third wavelength band, and the third color filter may be configured to transmit light in the first wavelength band and light in the third wavelength band.

The second color filter may be disposed only corresponding to the second pixels in the first pixel row, and no color filter may be disposed corresponding to the second pixels in the second pixel row.

The color separation element may extend along a diagonal direction of the second pixel.

The image sensor may further include a transparent dielectric layer disposed on the color filter layer, wherein the color separation element may be fixed within the transparent dielectric layer.

According to an aspect of another exemplary embodiment, an image sensor includes a pixel array including a first pixel row in which a plurality of first pixels and a plurality of second pixels are alternately arranged and a second pixel row in which a plurality of second pixels and a plurality of third pixels are alternately arranged; a first color separation element disposed facing the second pixels in the first pixel row, the first color separation element configured to direct light in a first wavelength band light toward the first pixels on the left and right sides and to direct light in a second wavelength band toward the second pixels; a second color separation element disposed facing the second pixels in the second pixel row, the second color separation element configured to direct light in a third wavelength band toward the third pixels on the left and right sides and to direct light in the second wavelength band toward the second pixels; and a color filter layer including a first color filter corresponding to the first pixels, a second color filter corresponding to the second pixels, and a third color filter corresponding to the third pixels, wherein the pass band of the second color filter is selected, such that an average crosstalk among a first channel corresponding to the first wavelength band, a second channel corresponding to the second wavelength band, and a third channel corresponding to the third wavelength band is from about 17% to about 25%.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
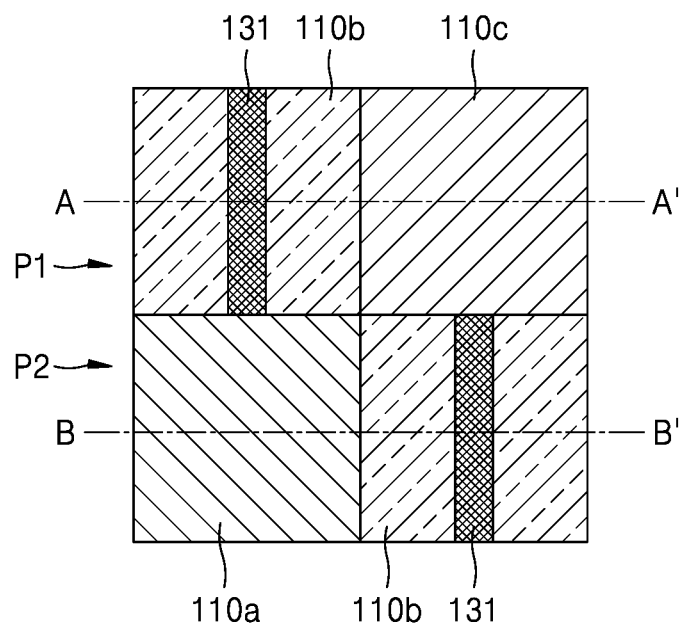
FIG. 1 is a schematic plan view of a pixel structure of an image sensor according to an exemplary embodiment.

Reference will now be made in detail to exemplary embodiments which are illustrated in the accompanying drawings, wherein like reference numerals refer to like elements throughout. In this regard, the present exemplary embodiments may have different forms and should not be construed as being limited to the descriptions set forth herein. Therefore, the exemplary embodiments are merely described below, by referring to the figures, to explain aspects.

An image sensor including a broadband color filter will be described below in detail with reference to the accompanying drawings. In the following descriptions, like reference numerals refer to like elements. In the drawings, the size of each element is exaggerated for clarity and convenience of explanation. Also, in the following description of a layer structure, when a layer is described to exist "on" or "above" another layer, the layer may directly contact or located without touching the other layer from above, below, left of, and right.

FIG. 1 is a schematic plan view of a pixel structure of an image sensor according to an exemplary embodiment. Referring to FIG. 1, the image sensor may have a Bayer pattern including a first pixel 110a and a third pixel 110c arranged in a first diagonal direction and two second pixels 110b arranged in a second diagonal direction intersecting the first diagonal direction. Although only one Bayer pattern unit is shown in FIG. 1 for convenience, the image sensor may include a pixel array including a plurality of Bayer patterns that are 2-dimensionally arranged. For example, the image sensor may include a first pixel row P1 in which a plurality of second pixels 110b and a plurality of third pixels 110c are alternately arranged in the horizontal direction and a second pixel row P2 in which a plurality of first pixels 110a and a plurality of second pixels 110b are alternately arranged in the horizontal direction. Furthermore, a plurality of first pixel rows P1 and a plurality of second pixel rows P2 may be alternately arranged in the vertical direction.

The image sensor may also include a plurality of color separation elements 131 arranged so that they respectively face the plurality of second pixels 110b in the first pixel row P1 and the plurality of second pixels 110b in the second pixel row P2. The color separation elements 131 separate incident light according to wavelength, so that light of different wavelength bands travels along different paths. The color separation element 131 may separate light into different colors by changing the path of light according to the wavelength by using the diffraction or refraction characteristics of light that vary according to wavelength. For example, the color separation element 131 may have any of various shapes, such as a transparent rod-like shape having a symmetrical or asymmetric structure, a prism-like shape having sloped surfaces, and the like, and any of various designs may be employed according to a desired spectral distribution of emitted light.

Figure 2A:
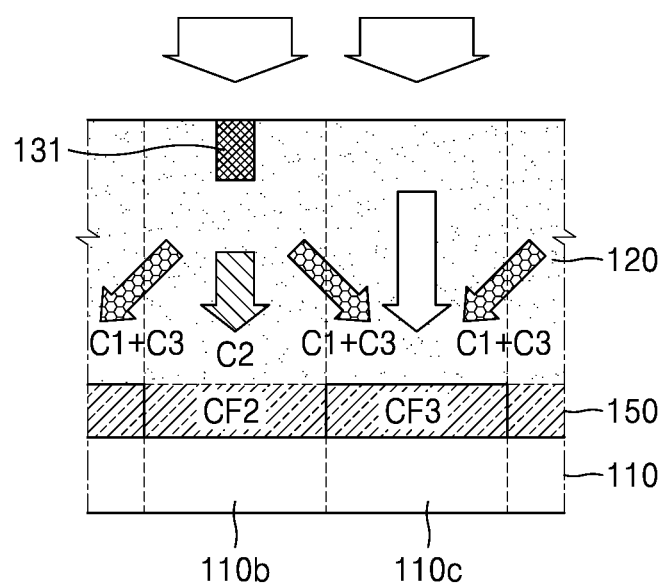
FIG. 2A is a cross-sectional view of the first pixel row P1 in the image sensor shown in FIG. 1, taken along a line A-A'.

FIG. 2A is a cross-sectional view of the first pixel row P1 in the image sensor shown in FIG. 1, taken along a line A-A'. Referring to FIG. 2A, the first pixel row P1 of the image sensor may include a light sensing layer 110 that converts the intensity of incident light into an electrical signal, a color filter layer 150 that is disposed on the light sensing layer 110 and transmits only light of a desired wavelength band, a transparent dielectric layer 120 disposed on the color filter layer 150, and a color separation element 131 that is disposed in and fixed within the transparent dielectric layer 120. Although not shown, a micro-lens may be further disposed on the transparent dielectric layer 120 to focus the incident light on the color separation element 131. The second pixel 110b and the third pixel 110c may be defined in the light sensing layer 110 of the first pixel row P1. The color filter layer 150 may include a second color filter CF2 that is disposed on the second pixel 110b and transmits light C2 in a second wavelength band and a third color filter CF3 that is disposed on the third pixel 110c and transmits light C3 in a third wavelength band.

In the first pixel row P1, the color separation element 131 may be disposed such that it faces the second pixel 110b. According to the present exemplary embodiment, the color separation element 131 may be configured to make light C2 in the second wavelength band travel in the direction of the central axis of the color separation element 131 and make light C1+C3, in the remaining wavelength bands, obliquely travel toward the left and right sides of the first color separation element 131, respectively. In other words, light that is separated by the color separation element 131 into different colors obliquely travels toward the left and right sides of the first color separation element 131 may be light C1+C3 that is a mixture of light C1 in the first wavelength band and light C3 in the third wavelength band. Therefore, the light C2 in the second wavelength band, of the light incident on the color separation element 131, travels toward the second pixel 110b, disposed just below the color separation element 131. The light C1+C3 that is a mixture of light C1 in the first wavelength band and light C3 in the third wavelength band, from light incident on the color separation element 131, travels toward the third pixel 110c.

The light C2 in the second wavelength band, separated by the color separation element 131, may then be incident on the second pixel 110b via the second color filter CF2. Furthermore, the light C3 in the third wavelength band, from the light C1+C3, that is a mixture of the light C1 in the first wavelength band and the light C3 in the third wavelength band, may be transmitted through the third color filter CF3 and may be incident on the third pixel 110c.

Figure 2B:
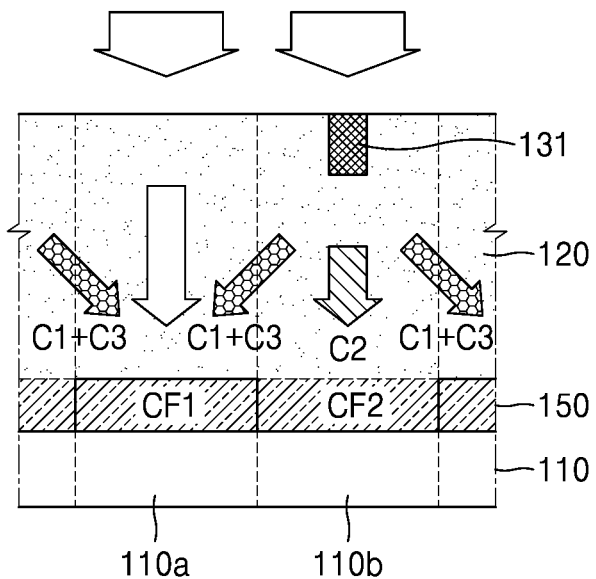
FIG. 2B is a cross-sectional view of the second pixel row P2 in the image sensor shown in FIG. 1, taken along the line B-B'.

FIG. 2B is a cross-sectional view of the second pixel row P2 in the image sensor shown in FIG. 1, taken along the line B-B'. Referring to FIG. 2B, the second pixel row P2 of the image sensor may include the light sensing layer 110 that converts the intensity of incident light into an electrical signal, the color filter layer 150 that is disposed on the light sensing layer 110 and transmits only light of a desired wavelength band, the transparent dielectric layer 120 disposed on the color filter layer 150, and the color separation element 131 that is disposed in and fixed within the transparent dielectric layer 120. As described above with reference to FIG. 2A, a micro-lens may be further disposed on the transparent dielectric layer 120 to focus the incident light on the color separation element 131. The first pixel 110a and the second pixel 110b may be defined in the light sensing layer 110 of the second pixel row P2. The color filter layer 150 may include a first color filter CF1 that is disposed on the first pixel 110a and transmits light C1 in the first wavelength band and the second color filter CF2 that is disposed on the second pixel 110b and transmits light C2 in the second wavelength band.

In the second pixel row P2, the color separation element 131 may be disposed such that it faces the second pixel 110b. As described above, the color separation element 131 may be configured to make the light C2 in the second wavelength band travel in the direction of the central axis of the color separation element 131 and make the light C1+C3 of the remaining wavelength bands obliquely travel toward the left and right sides of the first color separation element 131, respectively. Therefore, the light C2 of the second wavelength band, of light incident on the color separation element 131, travels toward the second pixel 110b, disposed just below the color separation element 131. Furthermore, the light C1+C3 that is a mixture of the light C1 in the first wavelength band and the light C3 in the third wavelength band from light incident on the color separation element 131 travels toward the first pixel 110a.

As a result, the light C2 in the second wavelength band, separated by the color separation element 131, may then be incident on the second pixel 110b via the second color filter CF2. Furthermore, the light C1 in the first wavelength band from the light C1+C3 that is a mixture of the light C1 in the first wavelength band and the light C3 in the third wavelength band may pass through the first color filter CF1 and be incident on the first pixel 110a. Here, for example, the light C1 in the first wavelength band may be red-based light, the light C2 in the second wavelength band may be green-based light, and the light C3 in the third wavelength band may be blue-based light, but are not limited thereto.

Compared to an image sensor including typical color filters without the use of the color separation element 131, in an image sensor including the color separation element 131 and typical color filters, light C2 and C1+C3, color-separated by the color separation element 131, are incident on the color filters, and thus light loss due to the color filters may be reduced. As a result, light utilization efficiency may be improved. However, since the color separation by the color separation element 131 is not perfect, even when the color separation element 131 and typical color filters are used together, there is a limit to the improvement of the light utilization efficiency. If color filters are not used, in order to further improve light utilization efficiency, the purity of color sensed by the image sensor may be deteriorated, and thus image quality may be lowered.

According to the present exemplary embodiment, a broadband color filter having a pass bandwidth wider than that of a typical color filter may be used as the second color filter CF2 in order to further improve light utilization efficiency without lowering color purity by using the color separation element 131 and the color filter layer 150. For example, the pass bandwidth of the second color filter CF2 may be greater than the pass bandwidth of the first color filter CF1 and the pass bandwidth of the third color filter CF3. The second color filter CF2 with such a wide pass bandwidth may transmit a some light C1 in the first wavelength band and some light C3 of the third wavelength band. Therefore, crosstalk, which is a phenomenon by which not only the light C2 of the second wavelength band, but also the light C1 of the first wavelength band and the light C3 of the third wavelength band are incident on the second pixel 110b, may occur. Therefore, most of the light absorbed by the second pixel 110b of the image sensor includes the light C2 of the second wavelength band, but may also include some light C1 in the first wavelength band and come light C3 in the third wavelength band.

Figure 3:
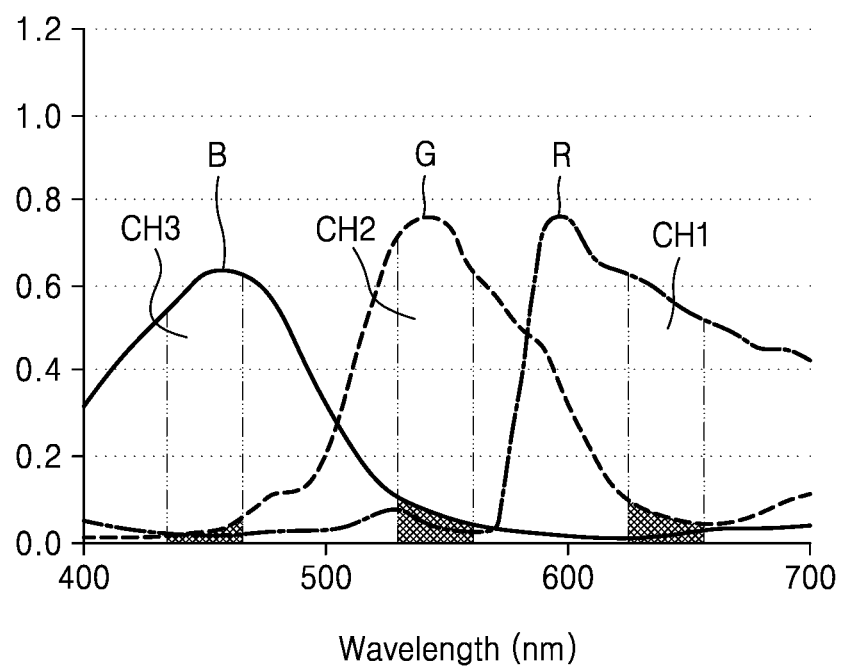
FIG. 3 is a graph showing an exemplary spectrum distribution of light absorbed by respective pixels of an image sensor in the case of using only a typical color filter.
Figure 4:
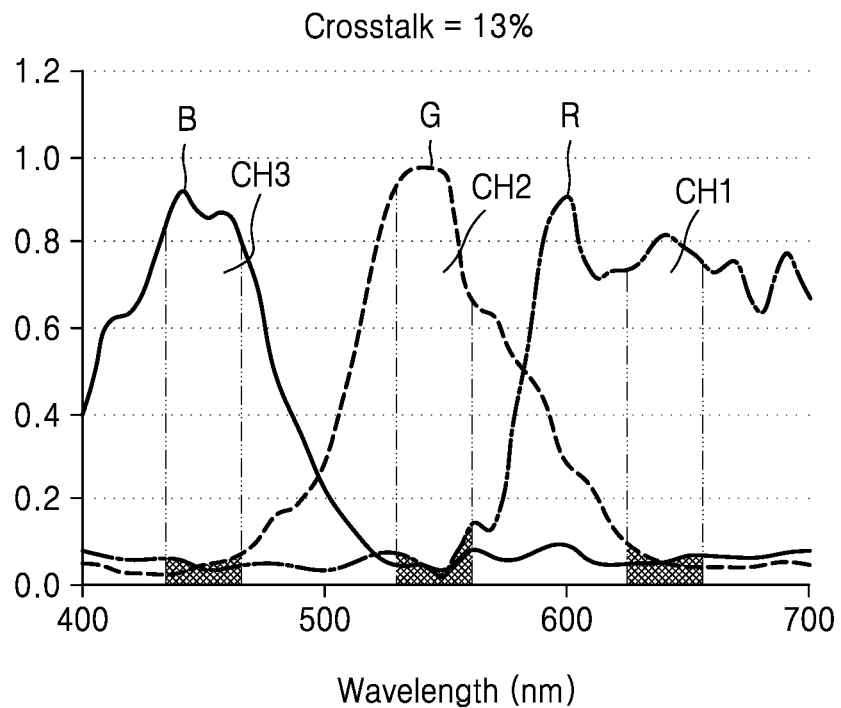
FIG. 4 is a graph showing an exemplary spectrum distribution of light absorbed by respective pixels of an image sensor when a color separation element and a typical color filter are used together.
Figure 5:
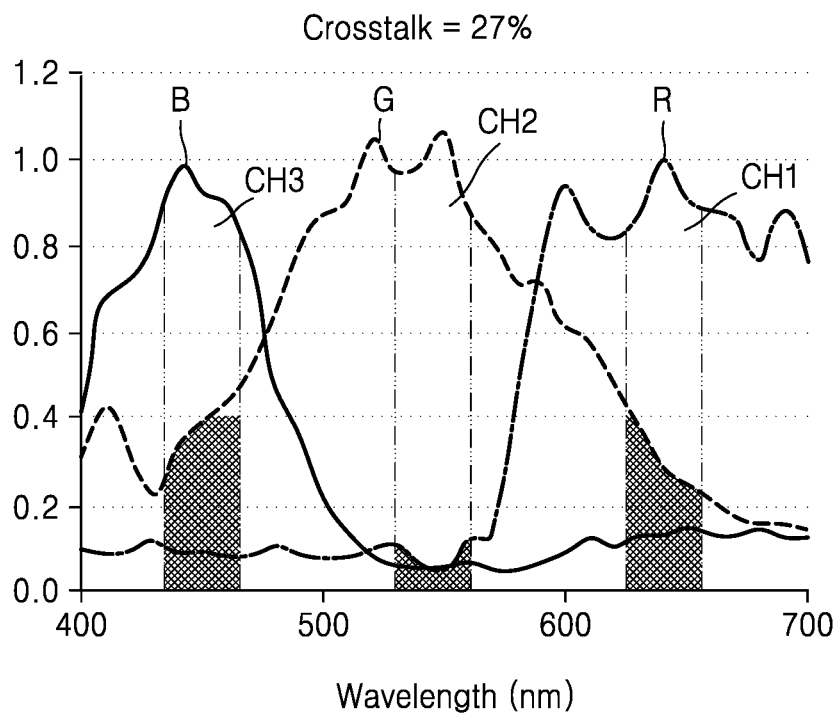
FIG. 5 is a graph showing an exemplary spectrum distribution of light absorbed by respective pixels of an image sensor when a color separation element are used without a green color filter.

Although crosstalk occurs even when a typical color filter is used, in the case of the present exemplary embodiment, the transmission characteristics of the second color filter CF2 are selected to intentionally increase crosstalk. For example, FIG. 3 is a graph showing an exemplary spectrum distribution of light absorbed by respective pixels of an image sensor in a case in which only a typical color filter is used without a color separation element 131. Furthermore, FIG. 4 is a graph showing an exemplary example spectrum distribution of light absorbed by respective pixels of an image sensor including the color separation element 131 and a typical color filter used together. FIG. 5 is a graph showing an exemplary spectrum distribution of light absorbed by respective pixels of an image sensor including a red color filter, a blue color filter, and a color separation element 131 used without a green color filter.

Referring to the graph of FIG. 3, crosstalk of about 14% occurs when only a typical color filter is used. Here, when a wavelength band representing a first color is defined as a first channel CH1, a wavelength band representing a second color is defined as a second channel CH2, and a wavelength band representing a third color is defined as a third channel CH3, crosstalk refers to average crosstalk among first through third channels CH1, CH2, and CH3. For example, when the first color is red, the second color is green, and the third color is blue, the wavelength band of the first channel CH1 may be defined as 630 nm±10 nm, the wavelength band of the second channel CH2 may be defined as 540 nm±10 nm, and the wavelength band of the third channel CH3 may be defined as 450 nm±10 nm. In the graph of FIG. 3, the first through third channels CH1, CH2, and CH3 are indicated by chain line regions.

As shown in the graph of FIG. 3, the first pixel 110a not only absorbs light of the first channel CH1, but also absorbs some light of the second channel CH2 and the third channel CH3. The second pixel 110b not only absorbs light of the second channel CH2, but also absorbs some light of the first channel CH1 and the third channel CH3. The third pixel 110c not only absorbs light of the third channel CH3, but also absorbs some light of the first channel CH1 and the second channel CH2. In a case in which a typical color filter alone is used, an average of the ratio of the light of the second channel CH2 and the light of the third channel CH3 to the light of the first channel CH1 absorbed by the first pixel 110a, the ratio of the light of the first channel CH1 and the light of third channel CH3 to the light of the second channel CH2 absorbed by the second pixel 110b, and the ratio of the light of the first channel CH1 and the light of the second channel CH2 to the light of the third channel CH3 absorbed by the third pixel 110c is about 14%. An image processing unit (not shown) of the image sensor performs color calculations by taking such crosstalk into account.

Referring to the graph of FIG. 4, crosstalk of about 13% occurs when the color separation element 131 and a typical color filter are used together. Furthermore, in this case, light utilization efficiency is improved by about 24% as compared to the case in which the color separation element 131 is not used. In order to further improve light utilization efficiency, when a green color filter is removed and only a red color filter, a blue color filter, and the color separation element 131 are used, light utilization efficiency is significantly improved to about 70%. However, as shown in the graph of FIG. 5, since a comparatively large amount of crosstalk, about 27% or more, occurs in this case, color purity is significantly deteriorated even when color calculations are performed by taking crosstalk into account.

Therefore, by adjusting the pass band of a green color filter to result in an amount of crosstalk that is intermediate between the case of FIG. 4 and the case of FIG. 5, the degradation of the color purity characteristics may be suppressed while sufficiently improving light utilization efficiency. For example, according to the present exemplary embodiment, the pass band of the second color filter CF2 may be selected, such that crosstalk falls between about 17% and about 25%. To this end, the pass bandwidth of the second color filter CF2 may be greater than that of a typical color filter. For example, the pass bandwidth of the second color filter CF2 may be greater than the pass bandwidth of the first color filter CF1 and the pass bandwidth of the third color filter CF3.

Figure 6:
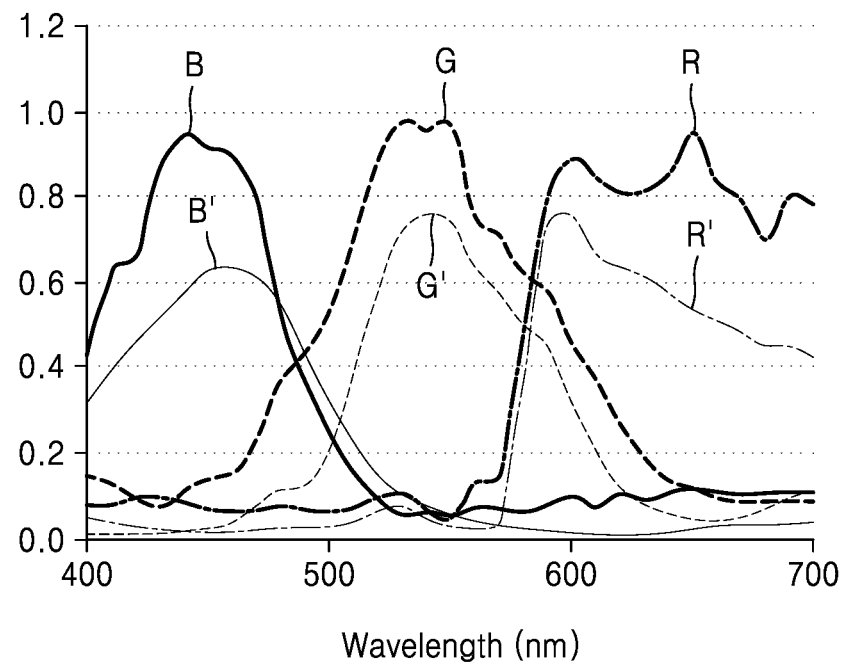
FIG. 6 is a graph showing an exemplary spectrum distribution of light absorbed by respective pixels of an image sensor shown in FIG. 1.

FIG. 6 is a graph showing an exemplary spectrum distribution of light absorbed by the first, second, and third pixels 110a, 110b, and 110c of the image sensor shown in FIG. 1 that employs a second color filter CF2 having a wide pass bandwidth. In FIG. 6, the graphs denoted by R, G, and B are absorption spectrum distributions in the image sensor according to the present exemplary embodiment, whereas the graphs denoted by R', G', and B' for comparison are absorption spectrum distributions when only a typical color filter is used. As shown in FIG. 6, it may be observed that both light utilization efficiency and crosstalk are increased according to the present exemplary embodiment.

In the example of FIG. 6, the first color filter CF1 is a typical red color filter, the second color filter CF2 is a broadband green color filter, and the third color filter CF3 is a typical blue color filter. In the graph shown in FIG. 6, crosstalk is about 18%. According to the present exemplary embodiment, by using a broadband color filter as the second color filter CF2 together with the color separation element 131, it is possible to improve both of light utilization efficiency and suppress color purity reduction. Furthermore, since the general Bayer pattern is maintained without modification, it is not necessary to significantly change the pixel structure or the image processing algorithm of a general image sensor. Particularly, in terms of performing color calculations, red, green, and blue colors may be easily restored simply by modifying some parameters without changing an algorithm.

Figure 7:
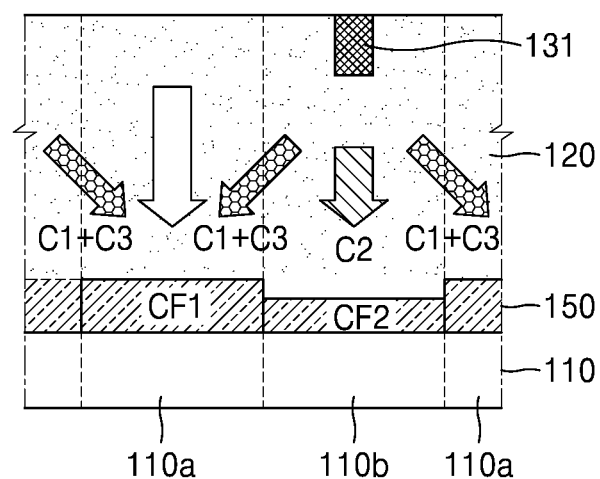
FIG. 7 is a cross-sectional view of the structure of a broadband color filter including an organic material.

Such a broadband color filter may be implemented in any of various ways. For example, FIG. 7 is a cross-sectional view of the structure of a broadband color filter including an organic material. Referring to FIG. 7, the second color filter CF2 may be a color filter including a general organic dye or an organic pigment. In this case, the thickness of the second color filter CF2 may be reduced to increase the pass bandwidth of the second color filter CF2. For example, the thickness of the second color filter CF2 may be less than the thickness of either of the first color filter CF1 and the third color filter CF3. Instead of adjusting the thickness, the pass bandwidth of the second color filter CF2 may be increased by reducing the concentration of the organic dye or organic pigment. For example, the concentration of an organic dye or an organic pigment in the second color filter CF2 may be lower than the concentration of an organic dye or an organic pigment in either the first color filter CF1 and the third color filter CF3.

Figure 8:
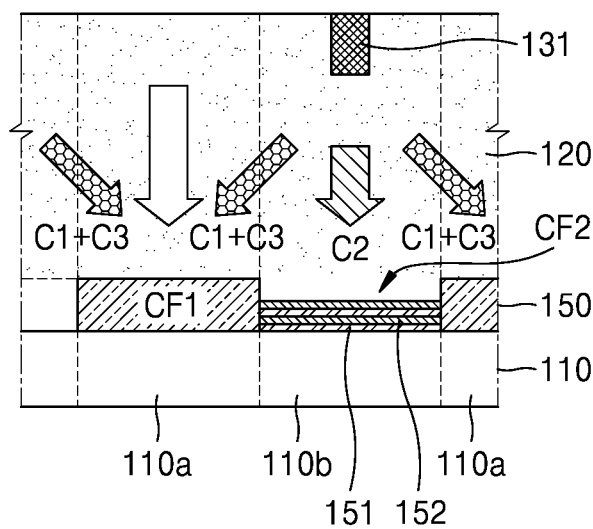
FIG. 8 is a cross-sectional view of the structure of a broadband color filter including an inorganic material.

Furthermore, a broadband color filter may be implemented using an inorganic material instead of an organic material. For example, FIG. 8 is a cross-sectional view of the structure of a broadband color filter including an inorganic material. Referring to FIG. 8, the second color filter CF2 may be disposed by alternately stacking two dielectric layers, for example, first and second dielectric layer 151 and 152, having different refractive indexes. For example, the second color filter CF2 may include the first dielectric layer 151 having a first refractive index and the second dielectric layer 152 having a second refractive index, the second refractive index being different from the first refractive index. Here, the first dielectric layer 151 and the second dielectric layer 152 may be alternately stacked at least once. The pass band of the second color filter CF2 may be adjusted by adjusting the first refractive index of the first dielectric layer 151, the second refractive index of the second dielectric layer 152, and the number of times that the first dielectric layer 151 and the second dielectric layer 152 are alternately stacked.

Figure 9:
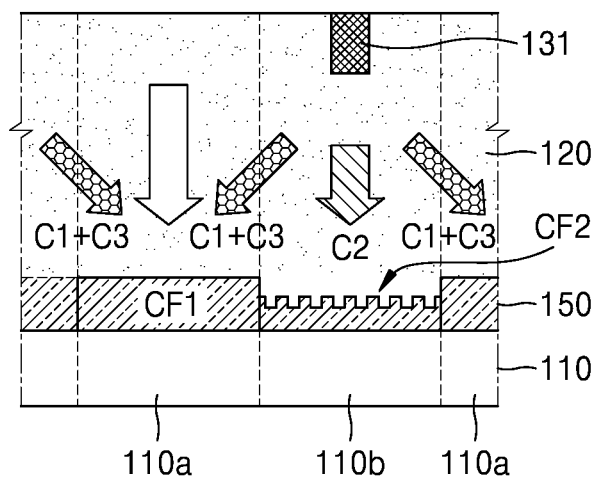
FIG. 9 is a cross-sectional view of a structure of a broadband color filter having a fine pattern structure.

Furthermore, a broadband color filter may be implemented by patterning an inorganic material into a fine pattern structure. FIG. 9 is a cross-sectional view of a structure of a broadband color filter having a fine pattern structure. Referring to FIG. 9, the second color filter CF2 may have a fine pattern structure patterned to transmit light of the entire second wavelength band, a part of the first wavelength band, and a part of the third wavelength band. The fine pattern structure may be, for example, a lattice structure having periodicity, a photonic crystal structure having periodicity, or a meta-material having a non-periodic pattern structure. The pass band of the second color filter CF2 may be adjusted by adjusting the structure of the fine pattern. Although FIG. 9 shows that the second color filter CF2 has a periodic lattice structure, the fine pattern structure is not limited thereto.

Figure 10A:
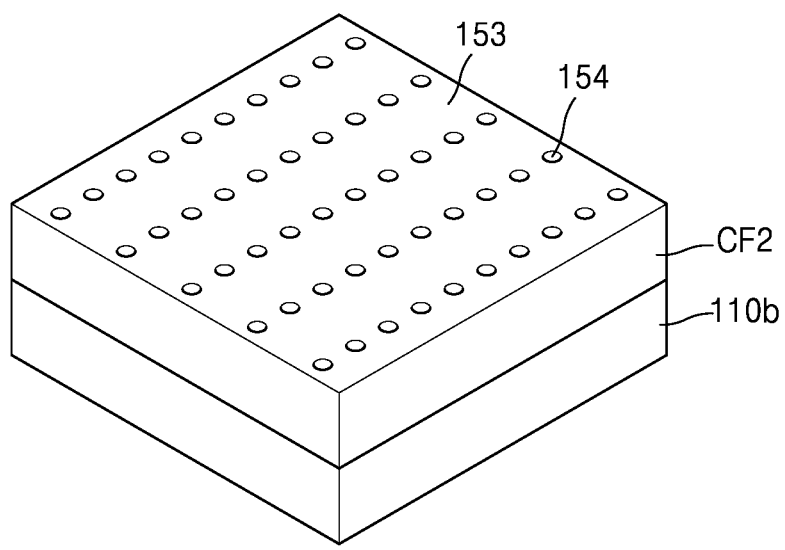
FIGS. 10A and 10B are perspective views of the structure of a broadband color filter having a fine pattern structure according to another exemplary embodiment.
Figure 10B:
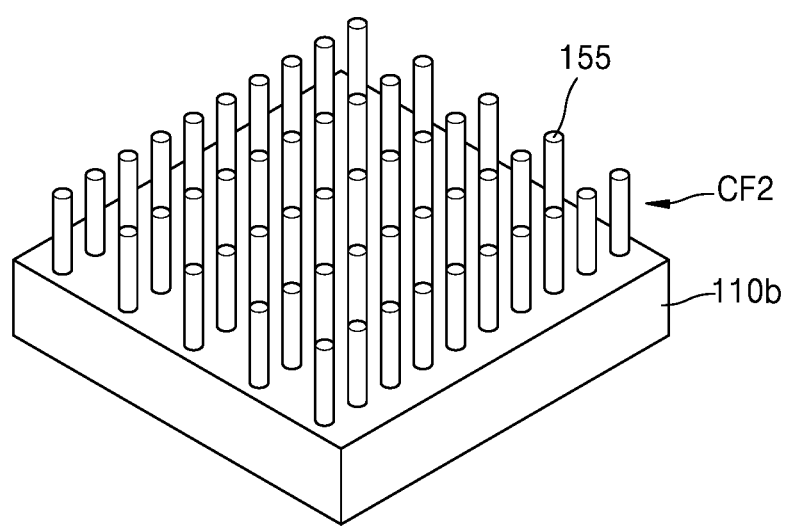

For example, FIGS. 10A and 10B are perspective views of the structure of a broadband color filter having a fine pattern structure according to another exemplary embodiment. Referring to FIG. 10A, the second color filter CF2 may include a dielectric layer 153 having a plurality of holes 154 periodically arranged in a two-dimensional array. The holes 154 may penetrate partially or entirely through the dielectric layer 153 and may be filled with another dielectric material having a different refractive index from the dielectric layer 153 or may be filled with air. The pass band of the second color filter CF2 may be defined according to the refractive index of the dielectric layer 15, and the size and the arrangement period of the holes 154. Furthermore, referring to FIG. 10B, the second color filter CF2 may include a plurality of dielectric pillars 155 periodically arranged in a two-dimensional array. In this structure, the pass band of the second color filter CF2 may be defined according to the refractive index, the size, and the arrangement period of the dielectric pillars 155.

The arrangement of the first, second, and third pixels 110*a*, 110*b*, and 110*c* and the characteristics of the color separation element 131 are not limited to those as shown and discussed with respect to the embodiment shown in FIG. 1 and may vary.

Figure 11:
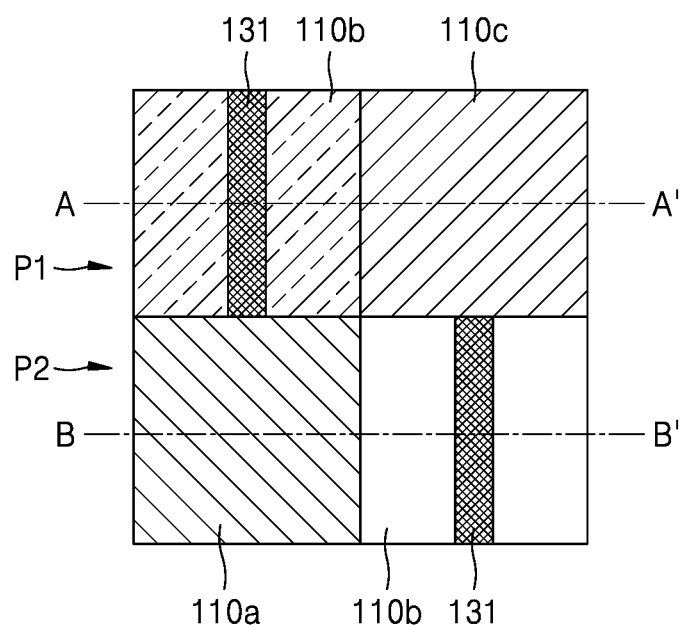
FIG. 11 is a schematic plan view of a pixel structure of an image sensor according to another exemplary embodiment
Figure 12:
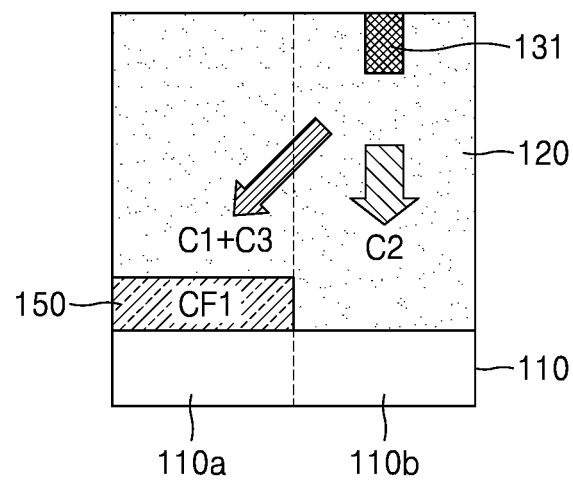
FIG. 12 is a sectional view of the image sensor shown in FIG. 11, taken along line B-B'.

For example, FIG. 11 is a schematic plan view of a pixel structure of an image sensor according to another exemplary embodiment, and FIG. 12 is a sectional view of the image sensor shown in FIG. 11, taken along line B-B'. Referring to FIGS. 11 and 12, the second color filter CF2, which is a broadband color filter having a wide bandwidth, may be disposed at only the second pixel 110*b* in the first pixel row P1. On the other hand, no color filter is disposed at the second pixel 110*b* in the second pixel row P2. In this case, although the light utilization efficiency and crosstalk may both increase in the second pixel row P2, a result of color calculations performed by the first pixel row P1 may compensate for the color purity calculated by the second pixel row P2.

Figure 13:
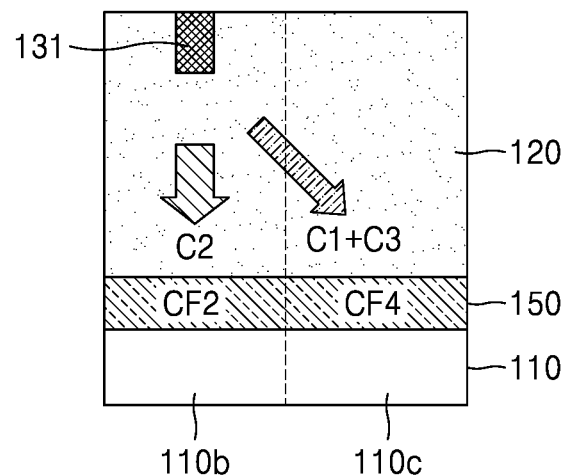
FIG. 13 is a cross-sectional view of a first pixel row P1 of an image sensor according to another exemplary embodiment.

Furthermore, although FIGS. 1 and 11 show that the third color filter CF3 for transmitting the third wavelength band light C3 is disposed at the third pixel 110*c* of the image sensor, the present disclosure is not limited thereto. For example, FIG. 13 is a cross-sectional view of the first pixel row P1 of an image sensor according to another exemplary embodiment. Referring to FIG. 13, a fourth color filter CF4 that transmits both the light C1 in the first wavelength band and the light C3 in the third wavelength band may be disposed at the third pixel 110*c* of the first pixel row P1. For example, when the light C1 of the first wavelength band is red light, the light C2 of the second wavelength band is green light, and the light C3 of the third wavelength band is blue light, the fourth color filter CF4 may be a magenta color filter that transmits red light and blue light. Since the fourth color filter CF4 transmits both the light C1 of the first wavelength band and the light C3 of the third wavelength band, light utilization efficiency may be increased. Furthermore, an amount of blue light may be obtained based on an amount of magenta light calculated by the first pixel row P1 and an amount of red light calculated by the second pixel row P2.

Figure 14:
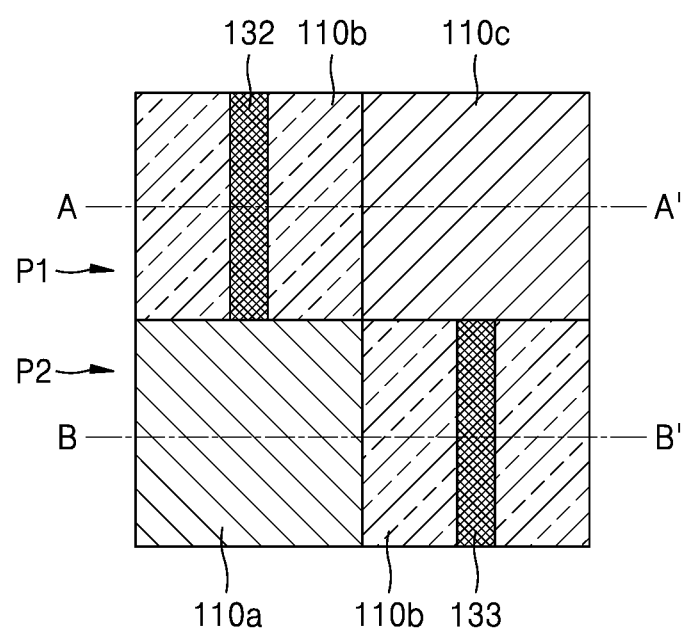
FIG. 14 is a schematic plan view of a pixel structure of an image sensor according to another exemplary embodiment.

FIG. 14 is a schematic plan view of a pixel structure of an image sensor according to another exemplary embodiment. Referring to FIG. 14, the image sensor includes the first pixel row P1 in which the plurality of second pixels 110*b* and the plurality of third pixels 110*c* are alternately arranged in the horizontal direction, the second pixel row P2 in which the plurality of first pixels 110*a* and the plurality of second pixels 110*b* are alternately arranged in the horizontal direction, first color separation elements 132 arranged facing the second pixels 110*b* in the first pixel row P1, and second color separation elements 133 arranged facing the second pixels 110*b* in the second pixel row P2.

The first color separation element 132 makes the light C3 of the third wavelength band, from incident light, obliquely travel toward the left and right sides of the first color separation element 132, respectively, and makes the light C2 of the second wavelength band pass therethrough and travel in a direction directly below the first color separation element 132. Therefore, the light C3 of the third wavelength band, separated by the first color separation element 132, may be incident on the third pixel 110*c* adjacent to the second pixel 110*b* in the first pixel row P1, and the light C2 of the second wavelength band may be incident on the second pixel 110*b*, facing the first color separation element 132, in the first pixel row P1. Furthermore, the second color separation element 133 makes the light C1 of the first wavelength band, from incident light, obliquely travel toward the left and right sides of the second color separation element 133, respectively, and makes the light C2 of the second wavelength band pass therethrough and travel in a direction directly below the second color separation element 133. Therefore, the light C1 of the first wavelength band, separated by the second color separation element 133, may be incident on the first pixel 110*a* adjacent to the second pixel 110*b* in the second pixel row P2, and the light C2 of the second wavelength band may be incident on the second pixel 110*b* facing the second color separation element 133 in the second pixel row P2.

Figure 15A:
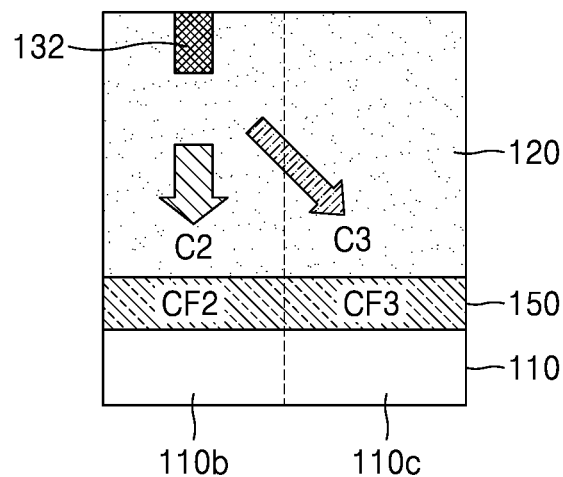
FIG. 15A is a cross-sectional view of an image sensor shown in FIG. 14, taken along line A-A'.

FIG. 15A is a cross-sectional view of the first pixel row P1 in the image sensor shown in FIG. 14, taken along line A-A'. Referring to FIG. 15A, the first pixel row P1 of the image sensor may include the light sensing layer 110 that converts the intensity of incident light into an electrical signal, the color filter layer 150 that is disposed on the light sensing layer 110 and transmits light of a desired wavelength band, the transparent dielectric layer 120 disposed on the color filter layer 150, and the first color separation element 132 that is disposed in and fixed within the transparent dielectric layer 120. Although not shown, the micro-lens may be further disposed on the transparent dielectric layer 120 to focus the incident light on the first color separation element 132. The second pixel 110*b* and the third pixel 110*c* may be arranged on the light sensing layer 110 of the first pixel row P1. The color filter layer 150 may include the second color filter CF2 that is disposed on the second pixel 110*b* and transmits the light C2 in the second wavelength band and the third color filter CF3 that is disposed on the third pixel 110*c* and transmits the light C3 in the third wavelength band. The first color separation element 132 may face the second pixel 110*b*.

As shown in FIG. 15A, from light incident on the first color separation element 132, the light C2 of the second wavelength band may pass through the second color filter CF2 to directly below the second color separation element 133 to enter the second pixel 110*b*. Furthermore, the light C3 of the third wavelength band may obliquely travel toward the left and right sides of the second color separation element 132, pass through the third color filter CF3, and be incident on the third pixel 110*c*. Even when the second and third color filters CF2 and CF3 are used, the light C2 and C3, significantly color-separated by the first color separation element 132, is incident on the second and third color filters CF2 and CF3, respectively. Therefore, light loss due to the color filter layer 150 is not significant. In order to further improve light utilization efficiency, a broadband color filter having a pass bandwidth that is wider than that of a typical color filter may be used as the second color filter CF2 as described above. In other words, the second color filter CF2 may transmit not only the light C2 of the second wavelength band, but also some light C1 of the first wavelength band and some light C3 of the third wavelength band.

Figure 15B:
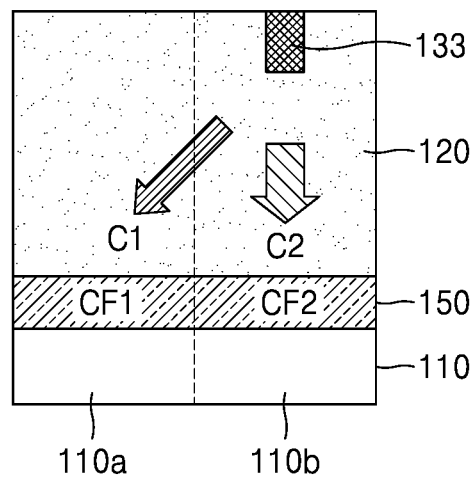
FIG. 15B is a cross-sectional view of an image sensor shown in FIG. 15B, taken along the line B-B'.

FIG. 15B is a cross-sectional view of the second pixel row P2 in the image sensor shown in FIG. 14, taken along the line B-B'. Referring to FIG. 15B, the second pixel row P2 of the image sensor may include the light sensing layer 110 that converts the intensity of incident light into an electrical signal, the color filter layer 150 that is disposed on the light sensing layer 110 and transmits light of a desired wavelength band, the transparent dielectric layer 120 disposed on the color filter layer 150, and the second color separation element 133 that is disposed in and fixed within the transparent dielectric layer 120. The first pixel 110*a* and the second pixel 110*b* may be arranged on the light sensing layer 110 of the second pixel row P2. The color filter layer 150 may include the first color filter CF1 that is disposed on the first pixel 110*a* and transmits light C1 of the first wavelength band and the second color filter CF2 that is disposed on the second pixel 110*b* and transmits light C2 of the second wavelength band. The second color separation element 133 may face the second pixel 110*b*.

As shown in FIG. 15B, from light incident on the second color separation element 133, the light C2 of the second wavelength band may pass through the second color filter CF2 to directly below the second color separation element 133 to enter the second pixel 110*b*. Furthermore, the light C1 of the first wavelength band may obliquely travel toward the left and right sides of the second color separation element 133, pass through the first color filter CF1, and be incident on the first pixel 110*a*. Even in the second pixel row P2, the second color filter CF2 may be a broadband color filter having a pass bandwidth that is wider than that of a typical color filter.

Figure 16:
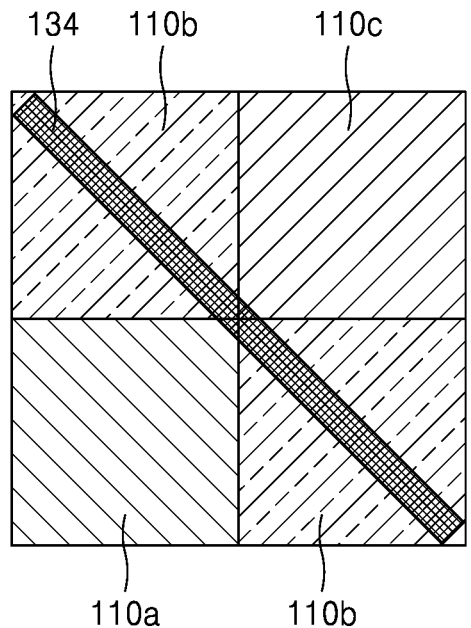
FIG. 16 is a schematic plan view of a pixel structure of an image sensor according to another exemplary embodiment.

FIG. 16 is a schematic plan view of a pixel structure of an image sensor according to another exemplary embodiment. Referring to FIG. 16, the image sensor may have a Bayer pattern including the first pixel 110*a* and the third pixel 110*c* arranged in the first diagonal direction and the two second pixels 110*b* arranged in the second diagonal direction intersecting the first diagonal direction. Furthermore, the image sensor may include a color separation element 134 extending in the second diagonal direction. As shown in FIG. 16, the color separation element 134 may be arranged in a direction diagonal to the second pixels 110*b* facing the second pixels 110*b*.

The color separation element 134 may be configured to make the light C1 of the first wavelength band, from incident light, obliquely travel toward the left side of the color separation element 134, make the light C2 of the second wavelength band travel in a direction right below the color separation element 134, and make the light C3 of the third wavelength band obliquely travel toward the right side of the color separation element 134. As a result, the light C1 of the first wavelength band separated by the color separation element 134 may then be incident on the first pixel 110*a* disposed on the left side of the color separation element 134, the light C2 of the second wavelength band may be incident on the second pixel 110*b* directly below the color separation element 134, and the light C3 of the third wavelength band may be incident on the third pixel 110*c* disposed on the right side of the color separation element 134. Instead, the color separation element 134 may make the light C2 of the second wavelength band, from incident light, travel toward the second pixel 110*b* directly below the color separation element 134 and make the light C1+C3, that is a mixture of the light C1 of the first wavelength band and the light C3 of the third wavelength band obliquely travel toward the left and right sides of the color separation element 134, respectively.

Figure 17:
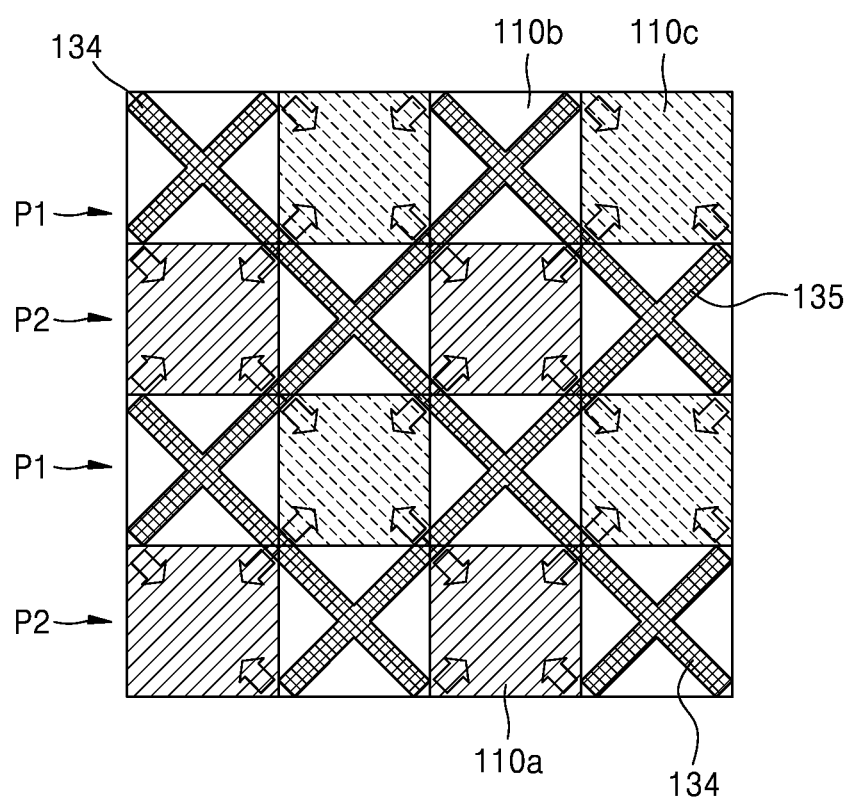
FIG. 17 is a schematic plan view of a pixel structure of an image sensor according to another exemplary embodiment.

FIG. 17 is a schematic plan view of a pixel structure of an image sensor according to another exemplary embodiment. Referring to FIG. 17, the image sensor may include the first pixel 110*a* and the third pixel 110*c* arranged in the first diagonal direction and the two second pixels 110*b* arranged in the second diagonal direction intersecting the first diagonal direction. Furthermore, the image sensor may include a first color separation element 134 extending in the second diagonal direction facing the plurality of second pixels 110*b* and a second color separation element 135 extending in the first diagonal direction facing the plurality of second pixels 110*b*. Therefore, the first color separation element 134 and the second color separation element 135 extend along two directions diagonal to the second pixels 110*b* and intersect with each other at the centers of the second pixels 110*b*.

The first color separation element 134 may be configured to make the light C2 of the second wavelength band pass therethrough and travel in a direction directly below the first color separation element 134 toward the second pixel 110*b* and make the light C1+C3 that is a mixture of the light C1 of the first wavelength band and the light C3 of the third wavelength band travel in the first diagonal direction. Furthermore, the second color separation element 135 may be configured to make the light C2 of the second wavelength band pass therethrough and travel in a direction directly below the second color separation element 135 and make the light C1+C3 that is a mixture of the light C1 of the first wavelength band and the light C3 of the third wavelength band travel in the second diagonal direction. As a result, as indicated by the arrows, the first pixel 110*a* and the third pixel 110*c* may receive the light C1 and C2 of the first and third wavelength bands from the first and second diagonal directions.

In the exemplary embodiments shown in FIGS. 16 and 17, the second color filter CF2 having a wide pass bandwidth to transmit light of the entire second wavelength band, a part of the first wavelength band, and a part of the third wavelength band may be disposed on the second pixel 110b.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An image sensor comprising:
   a pixel array comprising first pixels, second pixels, and third pixels arranged in a first pixel row comprising a plurality of the first pixels and a plurality of the second pixels alternately arranged and a second pixel row comprising a plurality of the second pixels and a plurality of the third pixels alternately arranged;
   a color separation element facing each of the plurality of second pixels and configured to direct light in a second wavelength band toward one of the plurality of second pixels and to direct light in a first wavelength band and light in a third wavelength band toward one of the plurality of first pixels or one of the plurality of third pixels; and
   a color filter layer comprising a first color filter corresponding to each of the plurality of first pixels, a second color filter corresponding to each of the plurality of second pixels, and a third color filter corresponding to each of the plurality of third pixels,
   wherein, an average crosstalk among a first channel corresponding to the first wavelength band, a second channel corresponding to the second wavelength band, and a third channel corresponding to the third wavelength band, is from about 17% to about 25%.

2. The image sensor of claim 1, wherein a pass band of the second color filter is larger than a pass band of the first color filter and larger than a pass band of the third color filter.

3. The image sensor of claim 1, wherein the first wavelength band is 630 nm±10 nm, the second wavelength band is 540 nm±10 nm, and the third wavelength band is 450 nm±10 nm.

4. The image sensor of claim 1, wherein the second color filter comprises at least one of an organic dye and an organic pigment, and a thickness of the second color filter is less than a thickness of the first color filter and less than a thickness of the third color filter, so that the average crosstalk among the first channel corresponding to the first wavelength band, the second channel corresponding to the second wavelength band, and the third channel corresponding to the third wavelength band, is from about 17% to about 25%.

5. The image sensor of claim 1, wherein the first color filter, the second color filter, and the third color filter correspond to a red color filter, a green color filter, and a blue color filter,
   the first channel, the second channel, and the third channel correspond to a red color channel, a green color channel, and a blue color channel, and
   the green color filter comprises an organic dye or an organic pigment, and thinner than the red color filter and the blue color filter in a vertical direction of the image sensor in which the pixel array and the color filter layer are arranged, so that the average crosstalk among the red color channel, the green color channel, and the blue color channel is from about 17% to about 25%.

6. The image sensor of claim 5, wherein a concentration of the at least one of the organic dye and the organic pigment in the second color filter is lower than a concentration of the at least one of the organic dye and the organic pigment in the first color filter and the third color filter.

7. The image sensor of claim 5, wherein the color separation element is disposed directly above the green color filter in the vertical direction of the image sensor.

8. The image sensor of claim 7, wherein the second color filter comprises a first dielectric layer having a first refractive index and a second dielectric layer having a second refractive index different from the first refractive index, and the first dielectric layer and the second dielectric layer are alternately stacked at least once.

9. The image sensor of claim 7, wherein the second color filter comprises a fine pattern structure patterned such that the second color filter transmits light in an entirety of the second wavelength band, light in a part of the first wavelength band, less than an entirety of the first wavelength band, and light in a part of the third wavelength band, less than an entirety of the third wavelength band.

10. The image sensor of claim 1, wherein the first color filter is configured to transmit light in the first wavelength band,
    the second color filter is configured to transmit light in an entirety of the second wavelength band, light in a part of the first wavelength band, less than an entirety of the first wavelength band, and light in a part of the third wavelength band, less than an entirety of the third wavelength band, and
    the third color filter is configured to transmit light in the third wavelength band.

11. The image sensor of claim 1, wherein the first color filter is configured to transmit first wavelength band light,
    the second color filter is configured to transmit light in an entirety of the entire second wavelength band, light in a part of the first wavelength band, less than an entirety of the first wavelength band, and light in a part of the third wavelength band, less than an entirety of the third wavelength band, and
    the third color filter is configured to transmit light in the first wavelength band and light in the third wavelength band.

12. An image sensor comprising:
    a pixel array comprising first pixels, second pixels, and third pixels arranged in a first pixel row comprising a plurality of the first pixels and a plurality of the second pixels alternately arranged and a second pixel row comprising a plurality of the second pixels and a plurality of the third pixels alternately arranged;
    a color separation element facing each of the plurality of second pixels and configured to direct light in a second wavelength band toward one of the plurality of second pixels and to direct light in a first wavelength band and light in a third wavelength band toward one of the plurality of first pixels or one of the plurality of third pixels; and
    a color filter layer comprising a first color filter corresponding to each of the plurality of first pixels, a second color filter corresponding to each of the plurality of second pixels, and a third color filter corresponding to each of the plurality of third pixels, wherein no color filter is disposed corresponding to the plurality of second pixels in the second pixel row, wherein, an average crosstalk among a first channel corresponding to the first wavelength band, a second channel corresponding to the second wavelength band, and a third channel corresponding to the third wavelength band, is from about 17% to about 25%.

13. The image sensor of claim 1, wherein the color separation element extends along a diagonal direction of the second pixel.

14. The image sensor of claim 1, further comprising a transparent dielectric layer disposed on the color filter layer, wherein the color separation element is fixed within the transparent dielectric layer.

15. An image sensor comprising:
a pixel array comprising first pixels, second pixels, and third pixels arranged in a first pixel row comprising a plurality of the first pixels and a plurality of the second pixels alternately arranged and a second pixel row comprising a plurality of the second pixels and a plurality of the third pixels alternately arranged;
a first color separation element facing each of the plurality of second pixels in the first pixel row, the first color separation element configured to direct light in a first wavelength band toward the plurality of first pixels and to direct light in a second wavelength band toward the plurality of second pixels;
a second color separation element disposed facing each of the plurality of second pixels in the second pixel row, the second color separation element configured to direct light in a third wavelength band toward the plurality of third pixels and to direct light in the second wavelength band toward the plurality of second pixels; and
a color filter layer comprising a first color filter corresponding to each of the plurality of first pixels, a second color filter corresponding to each of the plurality of second pixels, and a third color filter corresponding to each of the plurality of third pixels,
wherein, an average crosstalk among a first channel corresponding to the first wavelength band, a second channel corresponding to the second wavelength band, and a third channel corresponding to the third wavelength band is from about 17% to about 25%.

16. The image sensor of claim 15, wherein a pass band of the second color filter is larger than a pass band of the first color filter and larger than a pass band of the third color filter.

17. The image sensor of claim 15, wherein the first wavelength band is 630 nm±10 nm, the second wavelength band is 540 nm±10 nm, and the third wavelength band is 450 nm±10 nm.

18. The image sensor of claim 15, wherein the second color filter comprises at least one of an organic dye and an organic pigment, and a thickness of the second color filter is less than a thickness of the first color filter and less than a thickness of the third color filter, so that the average crosstalk among the first channel corresponding to the first wavelength band, the second channel corresponding to the second wavelength band, and the third channel corresponding to the third wavelength band, is from about 17% to about 25%.

19. The image sensor of claim 15, wherein the first color filter, the second color filter, and the third color filter correspond to a red color filter, a green color filter, and a blue color filter,
the first channel, the second channel, and the third channel correspond to a red color channel, a green color channel, and a blue color channel, and
the green color filter comprises an organic dye or an organic pigment, and thinner than the red color filter and the blue color filter in a vertical direction of the image sensor in which the pixel array and the color filter layer are arranged, so that the average crosstalk among the red color channel, the green color channel, and the blue color channel is from about 17% to about 25%.

20. The image sensor of claim 18, wherein a concentration of the at least one of the organic dye and the organic pigment in the second color filter is lower than a concentration of the at least one of the organic dye and the organic pigment in the first color filter and the third color filter.

21. The image sensor of claim 19, wherein the color separation element is disposed directly above the green color filter in the vertical direction of the image sensor.

22. The image sensor of claim 21, wherein the second color filter comprises a first dielectric layer having a first refractive index and a second dielectric layer having a second refractive index different from the first refractive index, and
the first dielectric layer and the second dielectric layer are alternately stacked at least once.

23. The image sensor of claim 22, wherein the second color filter comprises a fine pattern structure patterned such that the second color filter transmits light in an entirety of the second wavelength band, light in a part of the first wavelength band, less than an entirety of the first wavelength band, and light in a part of the third wavelength band, less than an entirety of the third wavelength band.

* * * * *